(12) United States Patent
Nasman et al.

(10) Patent No.: US 8,272,347 B2
(45) Date of Patent: Sep. 25, 2012

(54) HIGH TEMPERATURE GAS HEATING DEVICE FOR A VAPOR DEPOSITION SYSTEM

(75) Inventors: Ronald Nasman, Averill Park, NY (US); Jacques Faguet, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 595 days.

(21) Appl. No.: 12/559,398

(22) Filed: Sep. 14, 2009

(65) Prior Publication Data

US 2011/0061595 A1     Mar. 17, 2011

(51) Int. Cl.
*C23C 16/00* (2006.01)
(52) U.S. Cl. .................................. 118/723 HC
(58) Field of Classification Search ............. 118/723 HC
See application file for complete search history.

(56) References Cited

U.S. PATENT DOCUMENTS

| | | | |
|---|---|---|---|
| 4,148,575 A | | 4/1979 | Siryj |
| 4,958,592 A | * | 9/1990 | Anthony et al. ............. 118/724 |
| 4,970,986 A | * | 11/1990 | Anthony et al. ............. 118/724 |
| 5,160,544 A | | 11/1992 | Garg |
| 5,204,314 A | * | 4/1993 | Kirlin et al. .................. 505/447 |
| 5,318,809 A | * | 6/1994 | Sussman ....................... 427/561 |
| 5,594,280 A | | 1/1997 | Sekiguchi et al. |
| 5,833,753 A | * | 11/1998 | Herlinger et al. ............. 118/724 |
| 5,951,772 A | | 9/1999 | Matsuse et al. |
| 5,985,510 A | | 11/1999 | Akutsu et al. |
| 5,997,650 A | * | 12/1999 | Herlinger et al. ............. 118/724 |
| 6,106,630 A | | 8/2000 | Frankel |
| 6,214,706 B1 | | 4/2001 | Madan et al. |
| 6,427,622 B2 | * | 8/2002 | Madan et al. .......... 118/723 HC |
| 6,432,206 B1 | * | 8/2002 | Tolt ............................... 118/724 |
| 6,432,259 B1 | | 8/2002 | Noorbakhsh et al. |
| 6,576,354 B2 | | 6/2003 | Tsukatani et al. |
| 6,582,780 B1 | * | 6/2003 | Tolt ............................... 427/587 |
| 6,592,771 B1 | * | 7/2003 | Yamanaka et al. ............. 216/63 |

(Continued)

FOREIGN PATENT DOCUMENTS

JP       59121920 A       7/1984

OTHER PUBLICATIONS

International Search Report issued in Application No. PCT/US08/058087 mailed Jul. 1, 2008.

(Continued)

*Primary Examiner* — Jeffrie R Lund
(74) *Attorney, Agent, or Firm* — Wood, Herron & Evans, LLP

(57) ABSTRACT

A gas heating device that may be used in a system for depositing a thin film on a substrate using a vapor deposition process is described. The gas heating device may be configured for heating one or more constituents of a film forming composition. The gas heating device comprises one or more resistive heating elements. Additionally, the gas heating device comprises a mounting structure configured to support at least one of the one or more resistive heating elements. Furthermore, the gas heating device comprises a static mounting device coupled to the mounting structure and configured to fixedly couple the at least one of the one or more resistive heating elements to the mounting structure, and a dynamic mounting device coupled to the mounting structure and configured to automatically compensate for changes in a length of the at least one of the one or more resistive heating elements. Further yet, the dynamic mounting device comprises a thermal break configured to reduce heat transfer between the dynamic mounting device and the mounting structure.

19 Claims, 10 Drawing Sheets

U.S. PATENT DOCUMENTS

| | | | |
|---|---|---|---|
| 6,692,574 B1* | 2/2004 | Tolt ................................ | 118/715 |
| 6,887,578 B2 | 5/2005 | Gleason et al. | |
| 7,005,047 B2* | 2/2006 | Ishikura et al. .......... | 204/298.41 |
| 8,006,639 B2* | 8/2011 | Kim et al. .............. | 118/723 HC |
| 2001/0031541 A1* | 10/2001 | Madan et al. ................ | 438/482 |
| 2002/0189757 A1 | 12/2002 | Denton et al. | |
| 2003/0021595 A1 | 1/2003 | Xu et al. | |
| 2003/0047282 A1 | 3/2003 | Sago et al. | |
| 2004/0069231 A1 | 4/2004 | Chae | |
| 2004/0106269 A1 | 6/2004 | Deng et al. | |
| 2004/0149211 A1 | 8/2004 | Ahn et al. | |
| 2006/0219360 A1* | 10/2006 | Iwasaki .................... | 156/345.27 |
| 2008/0035059 A1* | 2/2008 | Wang et al. ............. | 118/723 HC |
| 2008/0035060 A1* | 2/2008 | Wang et al. ............. | 118/723 HC |
| 2008/0078325 A1* | 4/2008 | Matsuda et al. ....... | 118/723 HC |
| 2008/0241377 A1 | 10/2008 | Faguet | |
| 2009/0223452 A1* | 9/2009 | Nasman et al. ............... | 118/724 |
| 2011/0061595 A1* | 3/2011 | Nasman et al. ............... | 118/724 |
| 2011/0303145 A1* | 12/2011 | Lee et al. ..................... | 118/666 |
| 2011/0305831 A1* | 12/2011 | Lee et al. .................. | 427/248.1 |

OTHER PUBLICATIONS

Written Opinion issued in Application No. PCT/US08/058087 mailed Jul. 1, 2008.

U.S. Patent and Trademark Office, Non-final Office Action issued in related U.S. Appl. No. 11/693,067 dated Sep. 30, 2010, 10 pp.

U.S. Patent and Trademark Office, Final Office Action issued in related U.S. Appl. No. 11/693,067 dated Apr. 12, 2011, 13 pp.

* cited by examiner

HIGH TEMPERATURE GAS HEATING DEVICE FOR A VAPOR DEPOSITION SYSTEM

CROSS-REFERENCE TO RELATED APPLICATIONS

This application is related to pending U.S. patent application Ser. No. 11/693,067, entitled "VAPOR DEPOSITION SYSTEM AND METHOD OF OPERATING", filed on Mar. 29, 2007; and pending U.S. patent application Ser. No. 12/044,574, entitled "GAS HEATING DEVICE FOR A VAPOR DEPOSITION SYSTEM AND METHOD OF OPERATING", filed on Mar. 7, 2008. The entire content of these applications are herein incorporated by reference in their entirety.

BACKGROUND OF THE INVENTION

1. Field of Invention

The present invention relates to a system for thin film deposition, and more particularly to a system for depositing a thin film using a vapor deposition process.

2. Description of Related Art

During material processing, such as semiconductor device manufacturing for production of integrated circuits (ICs), vapor deposition is a common technique to form thin films, as well as to form conformal thin films over and within complex topography, on a substrate. Vapor deposition processes can include chemical vapor deposition (CVD) and plasma enhanced CVD (PECVD). For example, in semiconductor manufacturing, such vapor deposition processes may be used for gate dielectric film formation in front-end-of-line (FEOL) operations, and low dielectric constant (low-k) or ultra-low-k, porous or non-porous, dielectric film formation and barrier/seed layer formation for metallization in back-end-of-line (BEOL) operations, as well as capacitor dielectric film formation in DRAM production.

In a CVD process, a continuous stream of film precursor vapor is introduced to a process chamber containing a substrate, wherein the composition of the film precursor has the principal atomic or molecular species found in the film to be formed on the substrate. During this continuous process, the precursor vapor is chemisorbed on the surface of the substrate while it thermally decomposes and reacts with or without the presence of an additional gaseous component that assists the reduction of the chemisorbed material, thus, leaving behind the desired film.

In a PECVD process, the CVD process further includes plasma that is utilized to alter or enhance the film deposition mechanism. For instance, plasma excitation can allow film-forming reactions to proceed at temperatures that are significantly lower than those typically required to produce a similar film by thermally excited CVD. In addition, plasma excitation may activate film-forming chemical reactions that are not energetically or kinetically favored in thermal CVD.

Other CVD techniques include hot-filament CVD (otherwise known as hot-wire CVD or pyrolytic CVD). In hot-filament CVD, a film precursor is thermally decomposed by a resistively heated filament, and the resulting fragmented molecules adsorb and react on the surface of the substrate to leave the desired film. Unlike PECVD, hot-filament CVD does not require formation of plasma.

SUMMARY OF THE INVENTION

The invention relates to a system for depositing a thin film using a vapor deposition process.

The invention further relates to a method and system for depositing a thin film using pyrolytic CVD, whereby a gas heating device comprising one or more resistive film heating elements is utilized to pyrolize a film forming composition.

According to one embodiment, a gas heating device is described. The gas heating device may be configured to heat one or more constituents of a film forming composition. The gas heating device comprises one or more resistive heating elements configured to receive an electrical signal from one or more power sources. Additionally, the gas heating device comprises a mounting structure configured to support at least one of the one or more resistive heating elements. Furthermore, the gas heating device comprises a static mounting device coupled to the mounting structure and configured to fixedly couple the at least one of the one or more resistive heating elements to the mounting structure, and a dynamic mounting device coupled to the mounting structure and configured to automatically compensate for changes in a length of the at least one of the one or more resistive heating elements. Further yet, the dynamic mounting device comprises a thermal break configured to reduce heat transfer between the dynamic mounting device and the mounting structure.

According to another embodiment, a processing system for depositing a thin film on a substrate using a gas heating device is described. According to yet another embodiment, a gas distribution system for introducing a process gas to a processing system is described, wherein the gas distribution system comprises a gas heating device.

DETAILED DESCRIPTION OF SEVERAL EMBODIMENTS

In the following description, in order to facilitate a thorough understanding and for purposes of explanation and not limitation, specific details are set forth, such as a particular geometry of the deposition system and descriptions of various components.

However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Figure 1:
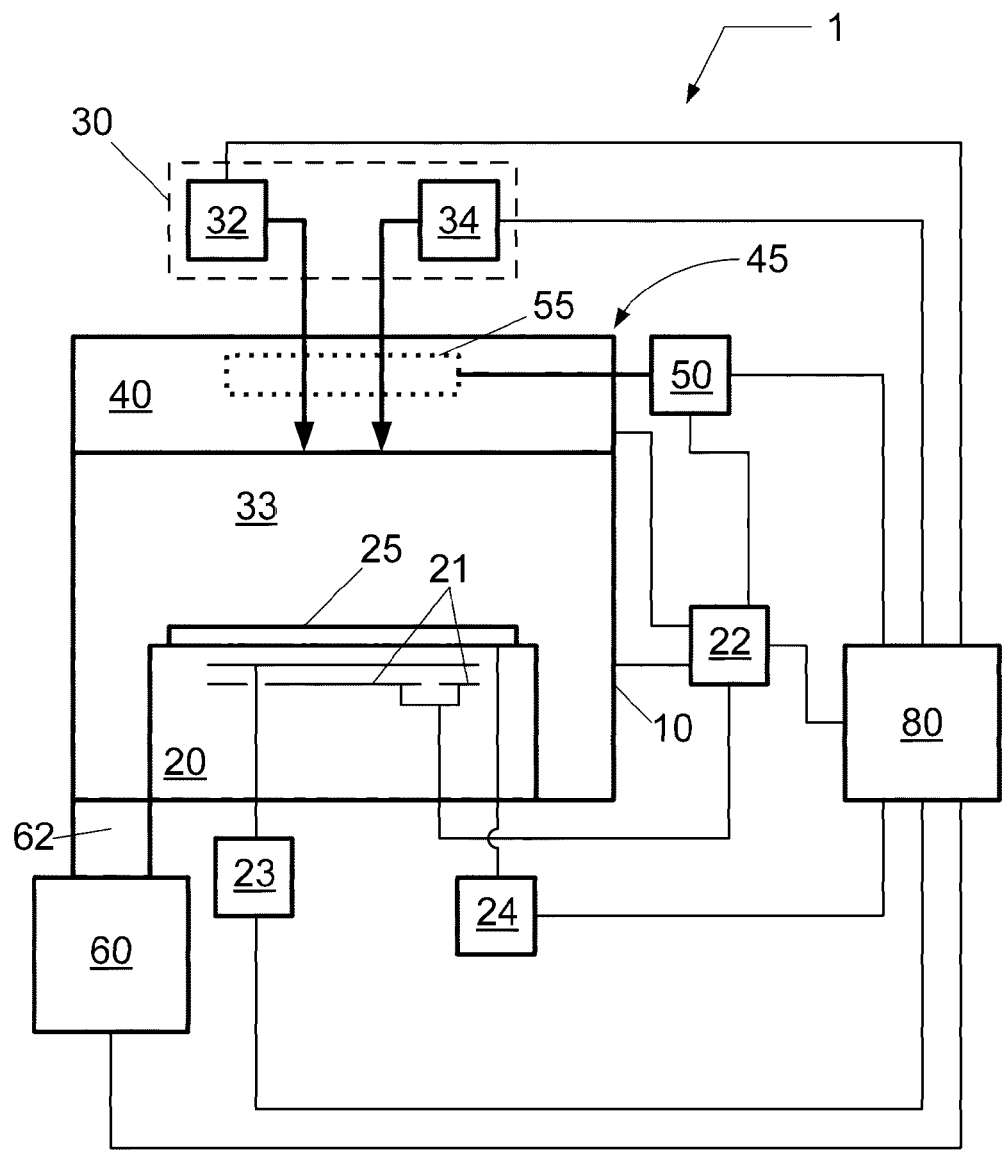
FIG. 1 depicts a schematic view of a deposition system according to an embodiment.

Referring now to the drawings, wherein like reference numerals designate identical or corresponding parts throughout the several views, FIG. 1 schematically illustrates a deposition system 1 for depositing a thin film, such as a conductive film, a non-conductive film, or a semi-conductive film. For example, the thin film can include a dielectric film, such as a low dielectric constant (low-k) or ultra-low-k dielectric film, or the thin film may include a sacrificial layer for use in air gap dielectrics. Deposition system 1 can include a chemical vapor deposition (CVD) system or thermally-assisted vapor deposition system, wherein a film forming composition is thermally activated or decomposed in order to form a film on a substrate. For example, the deposition system 1 comprises a filament-assisted CVD (FACVD) system or a pyrolytic CVD system.

The deposition system 1 comprises a process chamber 10 having a substrate holder 20 configured to support a substrate 25, upon which the thin film is formed. Furthermore, the substrate holder is configured to control the temperature of the substrate at a temperature suitable for the film forming reactions.

The process chamber 10 is coupled to a film forming composition delivery system 30 configured to introduce a film forming composition to the process chamber 10 through a gas distribution system 40. Furthermore, a gas heating device 45 is coupled to the gas distribution system 40 and configured to chemically modify the film forming composition. The gas heating device 45 comprises one or more heating elements 55 disposed on an interior surface of the gas distribution system 40 or embedded within the gas distribution system 40 or both, and a power source 50 that is coupled to the one or more heating elements 55 and that is configured to deliver electrical power to the one or more heating elements 55. For example, the one or more heating elements 55 can comprise one or more resistive heating elements. When electrical current flows through and effects heating of the one or more resistive heating elements, the interaction of these heated elements with the film forming composition causes pyrolysis of one or more constituents of the film forming composition.

The process chamber 10 is further coupled to a vacuum pumping system 60 through a duct 62, wherein the vacuum pumping system 60 is configured to evacuate the process chamber 10 and the gas distribution system 40 to a pressure suitable for forming the thin film on the substrate 25 and suitable for pyrolysis of the film forming composition.

The film forming composition delivery system 30 can include one or more material sources configured to introduce a film forming composition to the gas distribution system 40. For example, the film forming composition may include one or more gases, or one or more vapors formed in one or more gases, or a mixture of two or more thereof. The film forming composition delivery system 30 can include one or more gas sources, or one or more vaporization sources, or a combination thereof. Herein vaporization refers to the transformation of a material (normally stored in a state other than a gaseous state) from a non-gaseous state to a gaseous state. Therefore, the terms "vaporization," "sublimation" and "evaporation" are used interchangeably herein to refer to the general formation of a vapor (gas) from a solid or liquid precursor, regardless of whether the transformation is, for example, from solid to liquid to gas, solid to gas, or liquid to gas.

When the film forming composition is introduced to the gas distribution system 40, one or more constituents of the film forming composition are subjected to pyrolysis by the gas heating device 45 described above. The film forming composition can include film precursors that may or may not be fragmented by pyrolysis in the gas distribution system 40. The film precursor or precursors may include the principal atomic or molecular species of the film desired to be produced on the substrate. Additionally, the film forming composition can include a reducing agent that may or may not be fragmented by pyrolysis in the gas distribution system 40. The reducing agent or agents may assist with the reduction of a film precursor on substrate 25. For instance, the reducing agent or agents may react with a part of or substantially all of the film precursor on substrate 25. Additionally yet, the film forming composition can include a polymerizing agent (or cross-linker) that may or may not be fragmented by pyrolysis in the gas distribution system 40. The polymerizing agent may assist with the polymerization of a film precursor or fragmented film precursor on substrate 25.

According to one embodiment, when forming a copolymer thin film on substrate 25, a film forming composition comprising two or more monomer gases is introduced to the gas distribution system 40 and is exposed to the gas heating device 45, i.e., the one or more heating elements 55, having a temperature sufficient to pyrolyze one or more of the monomers and produce a source of reactive species. These reactive species are introduced to and distributed within process space 33 in the vicinity of the upper surface of substrate 25. Substrate 25 is maintained at a temperature lower than that of the gas heating device 45 in order to condensate and induce polymerization of the chemically altered film forming composition at the upper surface of substrate 25.

For example, when forming an organosilicon polymer, monomer gas(es) of an organosilicon precursor is used. Additionally, for example, when forming a fluorocarbon-organosilicon copolymer, monomer gases of a fluorocarbon precursor and organosilicon precursor are used.

Further yet, the film forming composition can include an initiator that may or may not be fragmented by pyrolysis in the gas distribution system 40. An initiator or fragmented initiator may assist with the fragmentation of a film precursor, or the polymerization of a film precursor. The use of an initiator can permit higher deposition rates at lower heat source temperatures. For instance, the one or more heating elements can be used to fragment the initiator to produce radical species of the initiator (i.e., a fragmented initiator) that are reactive with one or more of the remaining constituents in the film forming composition. Furthermore, for instance, the fragmented initiator or initiator radicals can catalyze the formation of radicals of the film forming composition.

For example, when forming a fluorocarbon-organosilicon copolymer, the initiator can be perfluorooctane sulfonyl fluoride (PFOSF) used in the polymerization of a cyclic vinylmethylsiloxane, such as 1,3,5-trivinyl-1,3,5-trimethylcyclotrisiloxane ($V_3D_3$).

Additionally, for example, when forming a porous SiCOH-containing film, the film forming composition may comprise a structure-forming material and a pore-generating material. The structure-forming material may comprise diethoxymethylsilane (DEMS) and the pore-generating material may comprise alpha-terpinene (ATRP). The porous SiCOH-containing film may be used as a low dielectric constant (low-k) material.

Further, for example, when forming a cross-linked neopentyl methacrylate organic glass, the film forming composition may comprise a monomer, a cross-linker, and an initiator. The monomer may comprise trimethylsilylmethyl methacrylate (TMMA), propargyl methacrylate (PMA), cyclopentyl methacrylate (CPMA), neopentyl methacrylate (npMA), and poly(neopentyl methacrylate) (P(npMA)), and the cross-linker may comprise ethylene glycol diacrylate (EGDA), ethylene glycol dimethacrylate (EGDMA), 1,3-propanediol diacrylate (PDDA), or 1,3-propanediol dimethacrylate (PDDMA), or any combination of two or more thereof. Additionally, the initiator may comprise one or more peroxides, one or more hydroperoxides, and/or one or more diazines. Additionally yet, the initiator may comprise a tert-butyl peroxide (TBPO), or a di-tert-butyl peroxide (DTBPO).

Further yet, for example, the polymer film may comprise P(npMA-co-EGDA) (poly(neopentyl methacrylate-co-ethylene glycol diacrylate)), and the monomer comprises npMA (neopentyl methacrylate) and the cross-linker comprises EGDA (ethylene glycol diacrylate). The polymer film may be used as a sacrificial air gap material.

According to one embodiment, the film forming composition delivery system 30 can include a first material source 32 configured to introduce one or more film precursors to the gas distribution system 40, and a second material source 34 configured to introduce a (chemical) initiator to the gas distribution system 40. Furthermore, the film forming composition delivery system 30 can include additional gas sources configured to introduce an inert gas, a carrier gas or a dilution gas. For example, the inert gas, carrier gas or dilution gas can include a noble gas, i.e., He, Ne, Ar, Kr, Xe, or Rn.

Referring again to FIG. 1, the power source 50 is configured to provide electrical power to the one or more resistive film heating elements in the gas distribution system 40. For example, the power source 50 can be configured to deliver either DC power or AC power. Additionally, for example, the power source 50 can be configured to modulate the amplitude of the power, or pulse the power. Furthermore, for example, the power source 50 can be configured to perform at least one of setting, monitoring, adjusting or controlling a power, a voltage, or a current.

Referring still to FIG. 1, a temperature control system 22 can be coupled to the gas distribution system 40, the gas heating device 45, the process chamber 10 and/or the substrate holder 20, and configured to control the temperature of one or more of these components. The temperature control system 22 can include a temperature measurement system configured to measure the temperature of the gas distribution system 40 at one or more locations, the temperature of the gas heating device 45 at one or more locations, the temperature of the process chamber 10 at one or more locations and/or the temperature of the substrate holder 20 at one or more locations. The measurements of temperature can be used to adjust or control the temperature at one or more locations in deposition system 1.

The temperature measuring device, utilized by the temperature measurement system, can include an optical fiber thermometer, an optical pyrometer, a band-edge temperature measurement system as described in pending U.S. patent application Ser. No. 10/168,544, filed on Jul. 2, 2002, the contents of which are incorporated herein by reference in their entirety, or a thermocouple such as a K-type thermocouple. Examples of optical thermometers include: an optical fiber thermometer commercially available from Advanced Energies, Inc., Model No. OR2000F; an optical fiber thermometer commercially available from Luxtron Corporation, Model No. M600; or an optical fiber thermometer commercially available from Takaoka Electric Mfg., Model No. FT-1420.

Alternatively, when measuring the temperature of one or more resistive heating elements, the electrical characteristics of each resistive heating element can be measured. For example, two or more of the voltage, current or power coupled to the one or more resistive heating elements can be monitored in order to measure the resistance of each resistive heating element. The variations of the element resistance can arise due to variations in temperature of the element which affects the element resistivity.

According to program instructions from the temperature control system 22 or the controller 80 or both, the power source 50 can be configured to operate the gas heating device 45, e.g., the one or more heating elements, at a temperature ranging from approximately 100 degrees C. to approximately 600 degrees C. For example, the temperature can range from approximately 200 degrees C. to approximately 550 degrees C. The temperature can be selected based upon the film forming composition and, more particularly, the temperature can be selected based upon a constituent of the film forming composition.

Additionally, according to program instructions from the temperature control system 22 or the controller 80 or both, the temperature of the gas distribution system 40 can be set to a value approximately equal to or less than the temperature of the gas heating device 45, i.e., the one or more heating elements. For example, the temperature can be a value less than or equal to approximately 1200 degrees C. Additionally, for example, the temperature can be a value less than approximately 1000 degrees C. Additionally, for example, the temperature can be a value less than approximately 800 degrees C. Additionally, for example, the temperature can be a value less than approximately 600 degrees C. Additionally, for example, the temperature can be a value less than approximately 550 degrees C. Further yet, for example, the temperature can range from approximately 80 degrees C. to approximately 550 degrees C. The temperature can be selected to be approximately equal to or less than the temperature of the one or more heating elements, and to be sufficiently high to prevent condensation which may or may not cause film formation on surfaces of the gas distribution system and reduce the accumulation of residue.

Additionally yet, according to program instructions from the temperature control system 22 or the controller 80 or both, the temperature of the process chamber 10 can be set to a value less than the temperature of the gas heating device 45, i.e., the one or more heating elements. For example, the temperature can be a value less than approximately 200 degrees C. Additionally, for example, the temperature can be a value less than approximately 150 degrees C. Further yet, for example, the temperature can range from approximately 80 degrees C. to approximately 150 degrees C. However, the temperature may be the same or less than the temperature of the gas distribution system 40. The temperature can be selected to be less than the temperature of the one or more resistive film heating elements, and to be sufficiently high to prevent condensation which may or may not cause film formation on surfaces of the process chamber and reduce the accumulation of residue.

Once film forming composition enters the process space 33, the film forming composition adsorbs on the substrate surface, and film forming reactions proceed to produce a thin film on the substrate 25. According to program instructions from the temperature control system 22 or the controller 80 or both, the substrate holder 20 is configured to set the temperature of substrate 25 to a value less than the temperature of the gas heating device 45, the temperature of the gas distribution system 40, and the process chamber 10. For example, the substrate temperature can range up to approximately 80 degrees C. Additionally, the substrate temperature can be approximately room temperature. For example, the substrate temperature can range up to approximately 25 degrees C. However, the temperature may be less than or greater than room temperature.

The substrate holder 20 comprises one or more temperature control elements 21 coupled to the temperature control system 22. The temperature control system 22 can include a substrate heating system, or a substrate cooling system, or both. For example, substrate holder 20 can include a substrate heating element or substrate cooling element (not shown) beneath the surface of the substrate holder 20. For instance, the heating system or cooling system can include a re-circulating fluid flow that receives heat from substrate holder 20 and transfers heat to a heat exchanger system (not shown) when cooling, or transfers heat from the heat exchanger system to the substrate holder 20 when heating. The cooling system or heating system may include heating/cooling elements, such as resistive heating elements, or thermoelectric heaters/coolers located within substrate holder 20. Additionally, the heating elements or cooling elements or both can be arranged in more than one separately controlled temperature zone. The substrate holder 20 may have two thermal zones, including an inner zone and an outer zone. The temperatures of the zones may be controlled by heating or cooling the substrate holder thermal zones separately.

Additionally, the substrate holder 20 comprises a substrate clamping system 23 (e.g., electrical or mechanical clamping system) to clamp the substrate 25 to the upper surface of substrate holder 20. For example, substrate holder 20 may include an electrostatic chuck (ESC).

Furthermore, the substrate holder 20 can facilitate the delivery of heat transfer gas to the back-side of substrate 25 via a backside gas supply system 24 to improve the gas-gap thermal conductance between substrate 25 and substrate holder 20. Such a system can be utilized when temperature control of the substrate is required at elevated or reduced temperatures. For example, the backside gas system can comprise a two-zone gas distribution system, wherein the backside gas (e.g., helium) pressure can be independently varied between the center and the edge of substrate 25.

Vacuum pumping system 60 can include a turbo-molecular vacuum pump (TMP) capable of a pumping speed up to approximately 5000 liters per second (and greater) and a gate valve for throttling the chamber pressure. For example, a 1000 to 3000 liter per second TMP can be employed. TMPs can be used for low pressure processing, typically less than approximately 1 Torr. For high pressure processing (i.e., greater than approximately 1 Torr), a mechanical booster pump and dry roughing pump can be used. Furthermore, a device for monitoring chamber pressure (not shown) can be coupled to the process chamber 10. The pressure measuring device can be, for example, a Type 628B Baratron absolute capacitance manometer commercially available from MKS Instruments, Inc. (Andover, Mass.).

Referring still to FIG. 1, the deposition system 1 can further comprise a controller 80 that comprises a microprocessor, memory, and a digital I/O port capable of generating control voltages sufficient to communicate and activate inputs to deposition system 1 as well as monitor outputs from deposition system 1. Moreover, controller 80 can be coupled to and can exchange information with the process chamber 10, the substrate holder 20, the temperature control system 22, the film forming composition delivery system 30, the gas distribution system 40, the gas heating device 45, and the vacuum pumping system 60, as well as the backside gas delivery system (not shown), and/or the electrostatic clamping system (not shown). A program stored in the memory can be utilized to activate the inputs to the aforementioned components of deposition system 1 according to a process recipe in order to perform the method of depositing a thin film.

Controller 80 may be locally located relative to the deposition system 1, or it may be remotely located relative to the deposition system 1 via an internet or intranet. Thus, controller 80 can exchange data with the deposition system 1 using at least one of a direct connection, an intranet, or the internet. Controller 80 may be coupled to an intranet at a customer site (i.e., a device maker, etc.), or coupled to an intranet at a vendor site (i.e., an equipment manufacturer). Furthermore, another computer (i.e., controller, server, etc.) can access controller 80 to exchange data via at least one of a direct connection, an intranet, or the internet.

The deposition system 1 can be periodically cleaned using an in-situ cleaning system (not shown) coupled to, for example, the process chamber 10 or the gas distribution system 40. Per a frequency determined by the operator, the in-situ cleaning system can perform routine cleanings of the deposition system 1 in order to remove accumulated residue on internal surfaces of deposition system 1. The in-situ cleaning system can, for example, comprise a radical generator configured to introduce chemical radical capable of chemically reacting and removing such residue. Additionally, for example, the in-situ cleaning system can, for example, include an ozone generator configured to introduce a partial pressure of ozone. For instance, the radical generator can include an upstream plasma source configured to generate oxygen or fluorine radical from oxygen ($O_2$), nitrogen trifluoride ($NF_3$), $O_3$, $XeF_2$, $ClF_3$, or $C_3F_8$ (or, more generally, $C_xF_y$), respectively. The radical generator can include an ASTRON® reactive gas generator, commercially available from MKS Instruments, Inc., ASTeX® Products (90 Industrial Way, Wilmington, Mass. 01887).

Figure 2:
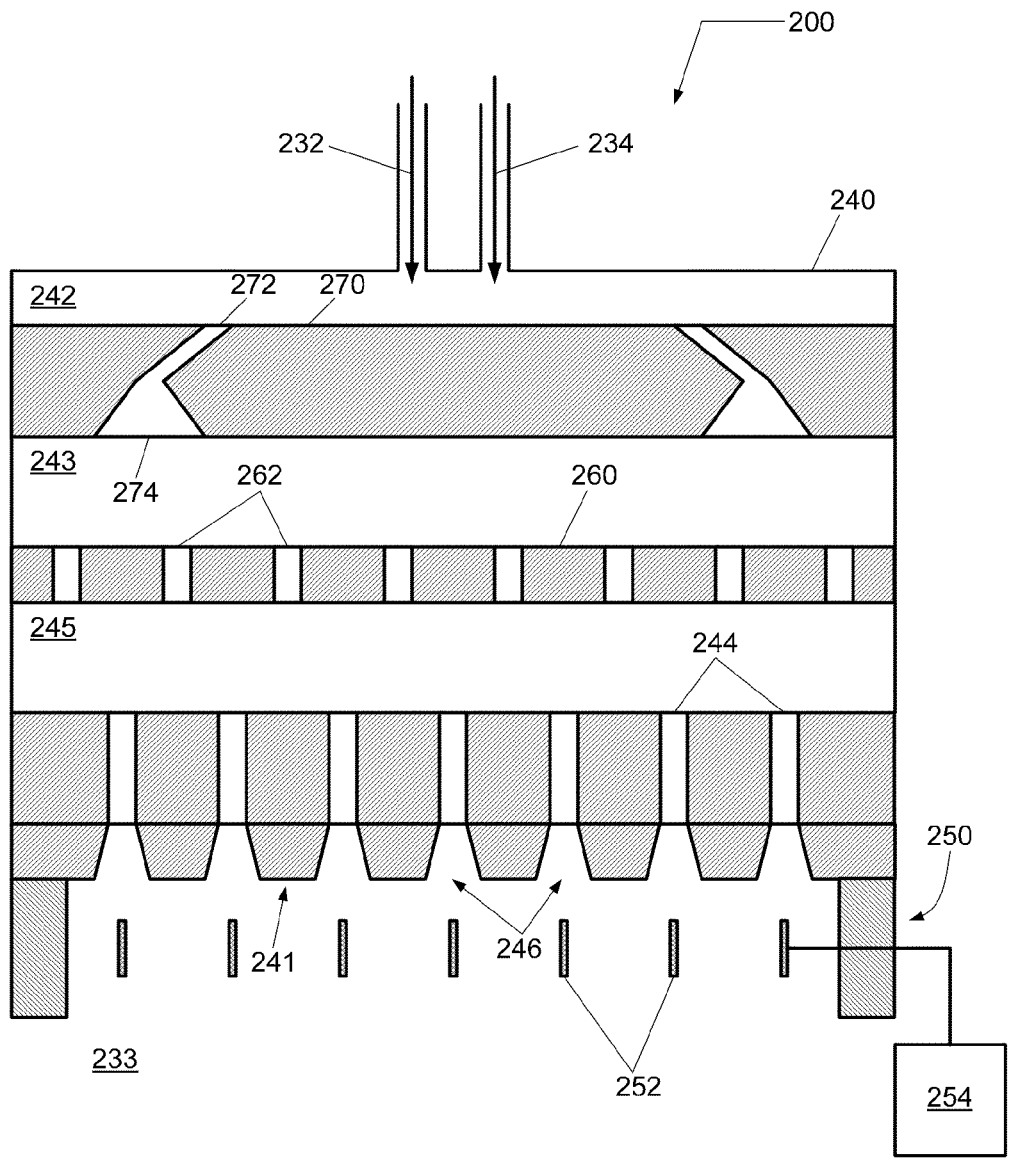
FIG. 2 depicts a schematic view of a gas distribution system according to an embodiment.

Referring now to FIG. 2, a gas distribution system 200 is illustrated according to an embodiment. The gas distribution system 200 comprises a housing 240 configured to be coupled to or within a process chamber of a deposition system (such as process chamber 10 of deposition system 1 in FIG. 1), and a gas distribution plate 241 configured to be coupled to the housing 240, wherein the combination form a plenum 242. The gas distribution plate 241 may be optional. The gas distribution system 200 may be thermally insulated from the process chamber, or it may not be thermally insulated from the process chamber.

The gas distribution system 200 is configured to receive a film forming composition into the plenum 242 from a film forming composition delivery system (not shown) and distribute the film forming composition in the process chamber. For example, the gas distribution system 200 can be configured to receive one or more constituents of a film forming composition 232 and an optional initiator 234 into plenum 242 from the film forming composition delivery system. The one or more constituents of the film forming composition 232 and the optional initiator 234 may be introduced to plenum 242 separately as shown, or they may be introduced through the same opening. Alternatively, the gas distribution system 200 may be configured to receive a cleaning fluid, solution, gas, etc. into plenum 242, replacing the film forming composition 232 and/or the optional initiator 234 when cleaning the deposition system, as discussed above in FIG. 1.

The gas distribution plate 241 comprises a plurality of openings 244 arranged to introduce and distribute the film forming composition from plenum 242 to a process space 233 proximate a substrate (not shown) upon which a film is to be formed. For example, gas distribution plate 241 comprises one or more outlets 246 configured to face the upper surface of a substrate.

Furthermore, the gas distribution system 200 comprises a gas heating device 250 having one or more heating elements 252 coupled to a power source 254 and configured to receive an electrical current from the power source 254. The one or more heating elements 252 are located at the outlet 246 of the gas distribution system 200, such that they may interact with any constituent of the film forming composition, or all of the constituents of the film forming composition including the optional initiator.

For example, the one or more heating elements 252 can comprise one or more resistive heating elements. Additionally, for example, the one or more heating elements 252 may include a metal-containing ribbon. Furthermore, for example, the one or more heating elements 252 can be composed of a resistive metal, a resistive metal alloy, a resistive metal nitride, or a combination of two or more thereof.

When the power source 254 couples electrical power to the one or more heating elements 252, the one or more heating elements 252 may be elevated to a temperature sufficient to pyrolize one or more constituents of the film forming composition. Power source 254 may include a direct current (DC) power source, or it may include an alternating current (AC) power source. Power source 254 may be configured to couple electrical power to the one or more heating elements 252 through a direct electrical connection to the one or more heating elements 252. Alternatively, power source 254 may be configured to couple electrical power to the one or more heating elements 252 through induction.

The one or more openings 244 formed in gas distribution plate 241 can include one or more orifices or one or more slots or a combination thereof. The one or more openings 244 can be distributed on the gas distribution plate 241 in a rectilinear pattern. Alternatively, the one or more openings 244 can be distributed on the gas distribution plate 241 in a circular pattern (e.g., orifices are distributed in a radial direction or angular direction or both). When the one or more heating elements 252 are located at the outlet 246 of the gas distribution system 200, each heating element can be positioned such that the flow of film forming composition and/or the optional initiator exiting from the one or more openings 244 of gas distribution plate 241 pass by or over at least one heating element.

Additionally, the plurality of openings 244 can be distributed in various density patterns on the gas distribution plate 241. For example, more openings can be formed near the center of the gas distribution plate 241 and fewer openings can be formed near the periphery of the gas distribution plate 241. Alternatively, for example, more openings can be formed near the periphery of the gas distribution plate 241 and fewer openings can be formed near the center of the gas distribution plate 241. Additionally yet, the size of the openings can vary on the gas distribution plate 241. For example, larger openings can be formed near the center of the gas distribution plate 241 and smaller openings can be formed near the periphery of the gas distribution plate 241. Alternatively, for example, smaller openings can be formed near the periphery of the gas distribution plate 241 and larger openings can be formed near the center of the gas distribution plate 241.

Referring still to FIG. 2, the gas distribution system 200 may comprise an intermediate gas distribution plate 260 coupled to housing 240 such that the combination of housing 240, intermediate gas distribution plate 260 and gas distribution plate 241 form an intermediate plenum 245 separate from plenum 242 and between the intermediate gas distribution plate 260 and the gas distribution plate 241. The intermediate gas distribution plate 260 may be optional. The gas distribution system 200 is configured to receive a film forming composition into the plenum 242 from a film forming composition delivery system (not shown) and distribute the film forming composition through the intermediate plenum 245 to the process chamber.

The intermediate gas distribution plate 260 comprises a plurality of openings 262 arranged to distribute and introduce the film forming composition to the intermediate plenum 245. The plurality of openings 262 can be shaped, arranged, distributed or sized as described above. The openings 262 in the intermediate gas distribution plate 260 may or may not be aligned with the one or more heating elements 252.

The gas distribution system 200 may further comprise a gas distribution manifold 270 coupled to housing 240 such that the combination of housing 240 and gas distribution manifold 270 form a second intermediate plenum 243 separate from plenum 242 and between the intermediate gas distribution plate 260 and the gas distribution manifold 270. The gas distribution system 200 is configured to receive a film forming composition into the plenum 242 from a film forming composition delivery system (not shown) and distribute the film forming composition through the second intermediate plenum 243 and the intermediate plenum 245 to the process chamber. The gas distribution manifold 270 comprises a one or more conduits 272 configured to distribute and introduce the film forming composition to the second intermediate plenum 243 through an annular groove 274.

Figure 3:
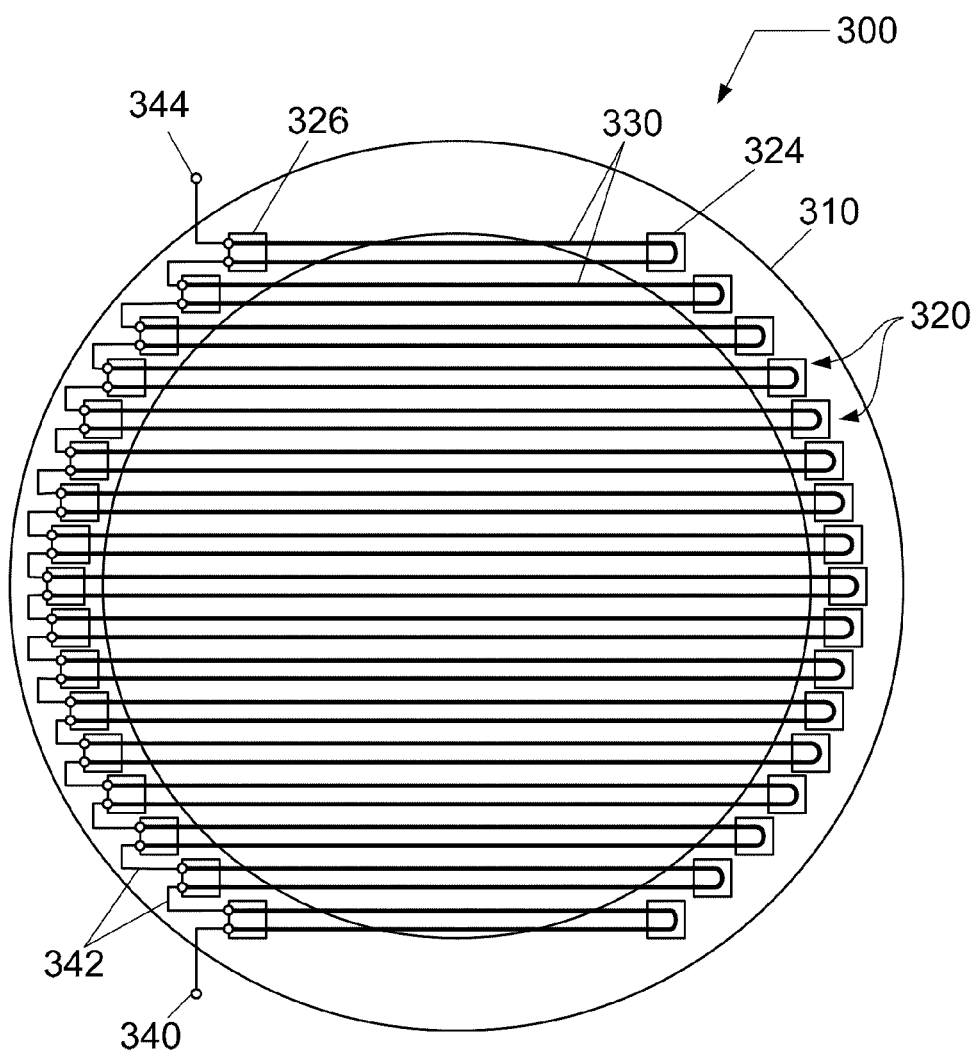
FIG. 3 provides a top view of a gas heating device according to an embodiment.

Referring now to FIG. 3, a top view of a gas heating device 300 is presented according to an embodiment. The gas heating device 300 is configured to heat one or more constituents of a film forming composition. The gas heating device 300 comprises one or more heat sources 320, wherein each heat source 320 comprises a resistive heating element 330 configured to receive an electrical current from one or more power sources. Additionally, the gas heating device 300 comprises a mounting structure 310 configured to support the one or more resistive heating elements 330. Furthermore, the one or more heat sources 320 may be mounted between the mounting structure 310 and an auxiliary mounting structure 312 (see FIG. 4B).

As shown in FIG. 3, the gas heating device 300 comprises one or more static mounting devices 326 coupled to the mounting structure 310 and configured to fixedly couple the one or more resistive heating elements 330 to the mounting structure 310, and the gas heating device 300 comprises one or more dynamic mounting devices 324 coupled to the mounting structure 310 and configured to automatically compensate for changes in a length of each of the one or more resistive heating elements 330. Further yet, the one or more dynamic mounting devices 324 may substantially reduce slippage between the one or more resistive heating elements 330 and the one or more dynamic mounting devices 324.

The one or more resistive heating elements 330 may be electrically coupled in series, as shown in FIG. 3, using electrical interconnects 342, wherein electrical current is supplied to the serial connection of one or more resistive heating elements 330 via, for example, connection of a first terminal 340 to the power source and a second terminal 344 to electrical ground for the power source. Alternatively, the one or more resistive heating elements 330 may be electrically coupled in parallel.

Figure 4A:
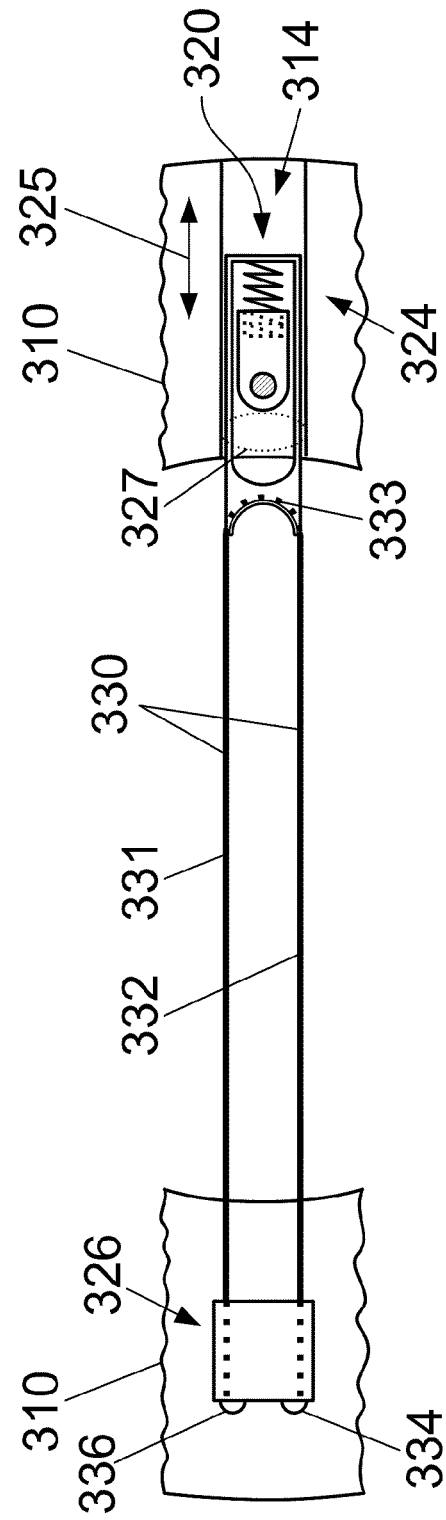
FIG. 4A provides a top view of a heating element according to an embodiment.
Figure 4B:
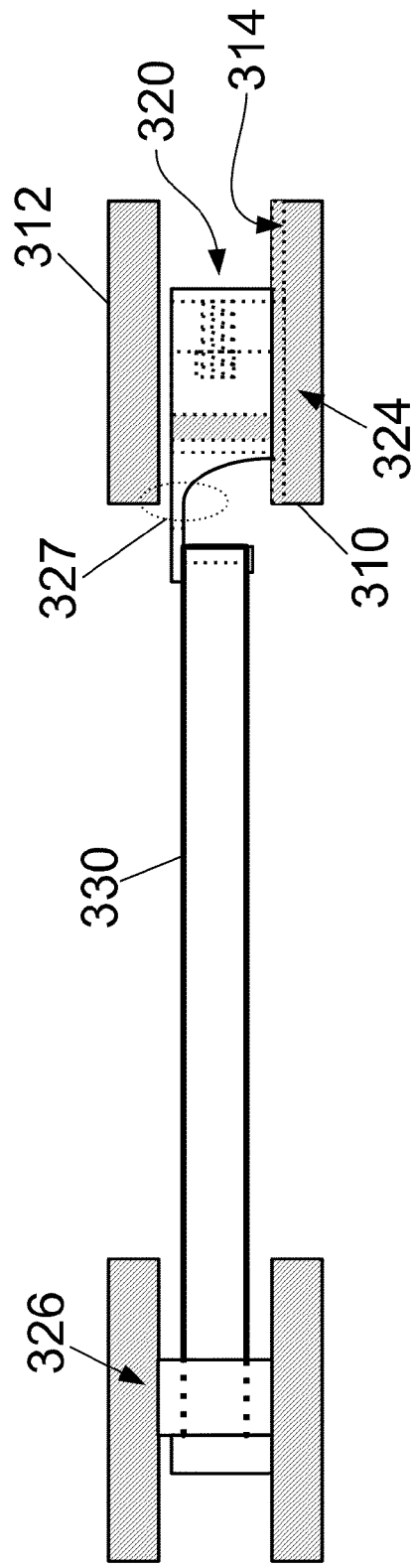
FIG. 4B provides a side view of the heating element shown in FIG. 4A.

Referring now to FIGS. 4A and 4B, a top view and a side view of heat source 320, respectively, is presented according to an embodiment. The resistive heating element 330 comprises a first end 334 fixedly coupled to one of the one or more static mounting devices 326, a second end 336 fixedly coupled to one of the one or more static mounting devices 326, a bend 333 coupled to one of the one or more dynamic mounting devices 324 and located between the first end 334 and the second end 336, a first straight section 332 extending between the first end 334 and the bend 333, and a second straight section 331 extending between the second end 336 and the bend 333. The first end 334 and the second end 336 may be fixedly coupled to the same static mounting device or different static mounting devices.

As illustrated in FIGS. 4A and 4B, the first straight section 332 and the second straight section 331 may be substantially the same length. When the first straight section 332 and the second straight section 331 are substantially the same length, the respective changes in length for the first straight section 332 and the second straight section 331 due to temperature variations are substantially the same. Alternatively, the first straight section 332 and the second straight section 331 may be different lengths.

Also, as illustrated in FIGS. 4A and 4B, the bend 333 comprises a 180 degree bend. Alternatively, the bend 333 comprises a bend ranging from greater than 0 degrees to less than 360 degrees.

The static mounting device 326 is fixedly coupled to the mounting structure 310. The dynamic mounting device 324 is configured to adjust in a linear direction 325 parallel with the first straight section 332 and the second straight section 331 in order to compensate for changes in the length of the first straight section 332 and the length of the second straight section 331. In this embodiment, the dynamic mounting device 324 can alleviate slack or sagging in the resistive heating element 330, and it may substantially reduce or minimize slippage between the resistive heating element 330 and the dynamic mounting device 324 (such slippage may cause particle generation and/or contamination). Furthermore, the dynamic mounting device 324 comprises a thermal break 327 configured to reduce heat transfer between the dynamic mounting device 324 and the mounting structure 310.

Referring now to FIGS. 5A, 5B, 5C, and 5D, a top view, a side view, a cross-sectional view, and a perspective view of the dynamic mounting device 324, respectively, is presented according to an embodiment. The dynamic mounting device 324 comprises a static structure 350 fixedly coupled to the mounting structure 310. The static structure 350 includes a guide feature 352 and a helical spring 370 configured to be received by the guide feature 352 of the static structure 350. The dynamic mounting device 324 further comprises a dynamic structure 360 dynamically coupled to the mounting structure 310. The dynamic structure 360 comprises a capture member 362 configured to retain at least one of the one or more resistive heating elements 330, a slidable member 363 configured to slidably mate with the static structure 350 and compress the helical spring 370 against the static structure 350 when loaded with the at least one of the one or more resistive heating elements 330, and the thermal break 327 disposed between the capture member 362 and the slidable member 363. The restoring force of the helical spring 370 may maintain the resistive heating element 330 under tensile stress and/or alleviate the resistive heating element 330 from slack or sagging.

Figure 5A:
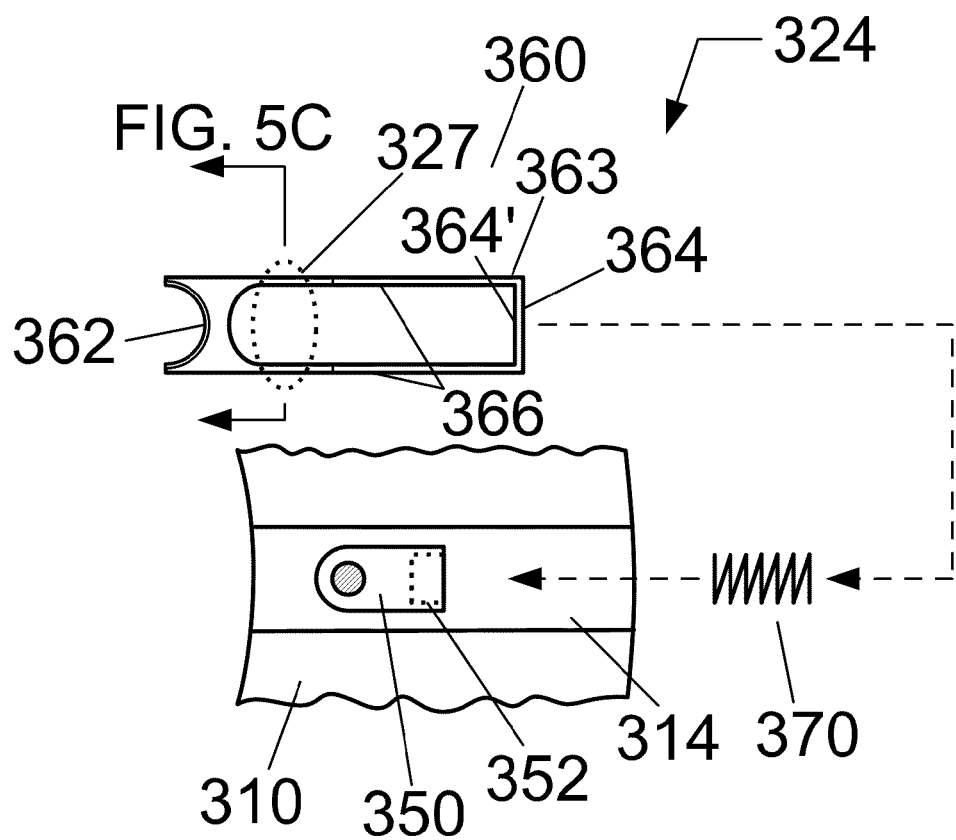
FIG. 5A provides a top view of a dynamic mounting device according to an embodiment.

As shown in FIG. 5A, the slidable member 363 comprises a load member 364 having a load surface 364' configured to contact the helical spring 370 and a pair of guide rail members 366 extending from the load member 364, wherein each of the pair of guide rail members 366 extend on opposite sides of the static structure 350 and having guide surfaces parallel with opposing faces of the static structure 350. Moreover, the mounting structure 310 may comprise a groove 314 configured to receive the base of the dynamic structure 360 and further guide its motion.

Figure 5B:
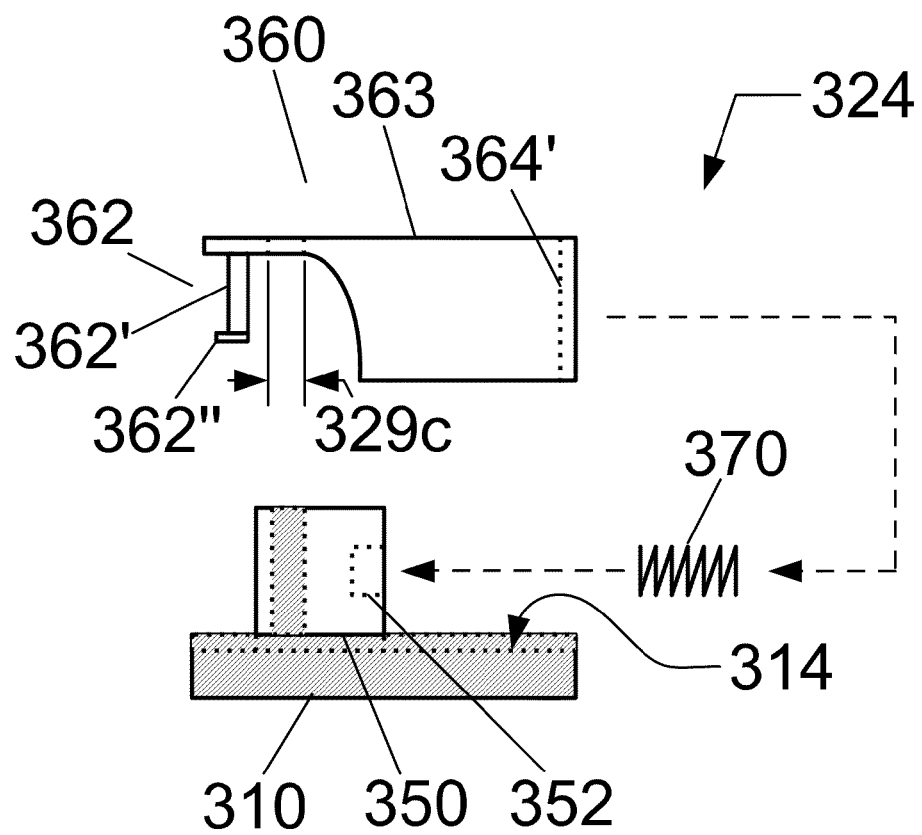
FIG. 5B provides a side view of the dynamic mounting device shown in FIG. 5A.

As shown in FIG. 5B, the capture member 362 comprises a shaped surface 362' configured to contact bend 333 of the resistive heating element 330. Additionally, the capture member 362 comprises a lip 362" configured to prevent the resistive heating element 330 from slipping off of the capture member 362.

The static mounting device 326, the dynamic mounting device 324, or both the static mounting device 326 and the dynamic mounting device 324 may be fabricated from an electrically non-conductive or insulating material. Additionally, the static mounting device 326, the dynamic mounting device 324, or both the static mounting device 326 and the dynamic mounting device 324 may be fabricated from a thermally insulating material. Furthermore, the static mounting device 326, the dynamic mounting device 324, or both the static mounting device 326 and the dynamic mounting device 324 may be fabricated from a ceramic or a plastic. Further yet, for example, the static mounting device 326, the dynamic mounting device 324, or both the static mounting device 326 and the dynamic mounting device 324 may be fabricated from quartz, silicon nitride, silicon carbide, sapphire, alumina, aluminum nitride, polytetrafluoroethylene, polyimide, etc.

The static structure 350, the dynamic structure 360, or both the static structure 350 and the dynamic structure 360 may be fabricated from an electrically non-conductive or insulating material. Additionally, the static structure 350, the dynamic structure 360, or both the static structure 350 and the dynamic structure 360 may be fabricated from a thermally insulating material. Furthermore, the static structure 350, the dynamic structure 360, or both the static structure 350 and the dynamic structure 360 may be fabricated from a ceramic or a plastic. Further yet, for example, the static structure 350, the dynamic structure 360, or both the static structure 350 and the dynamic structure 360 may be fabricated from quartz, silicon nitride, silicon carbide, sapphire, alumina, aluminum nitride, polytetrafluoroethylene, polyimide, etc.

Figure 5C:
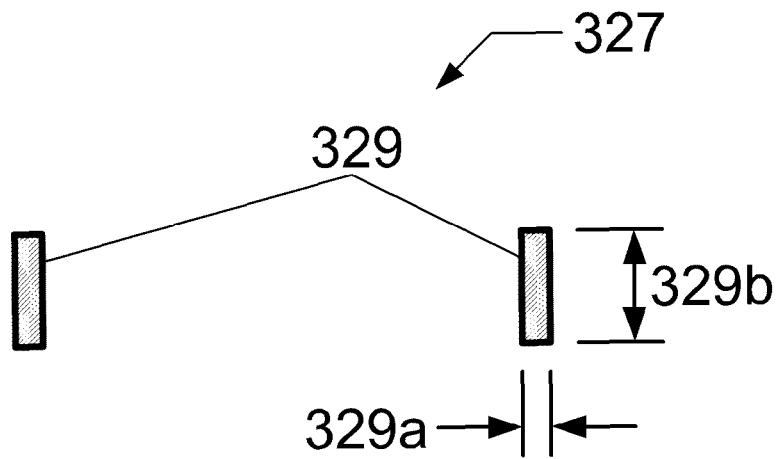
FIG. 5C provides a cross-sectional view of the dynamic mounting device shown in FIG. 5A.
Figure 5D:
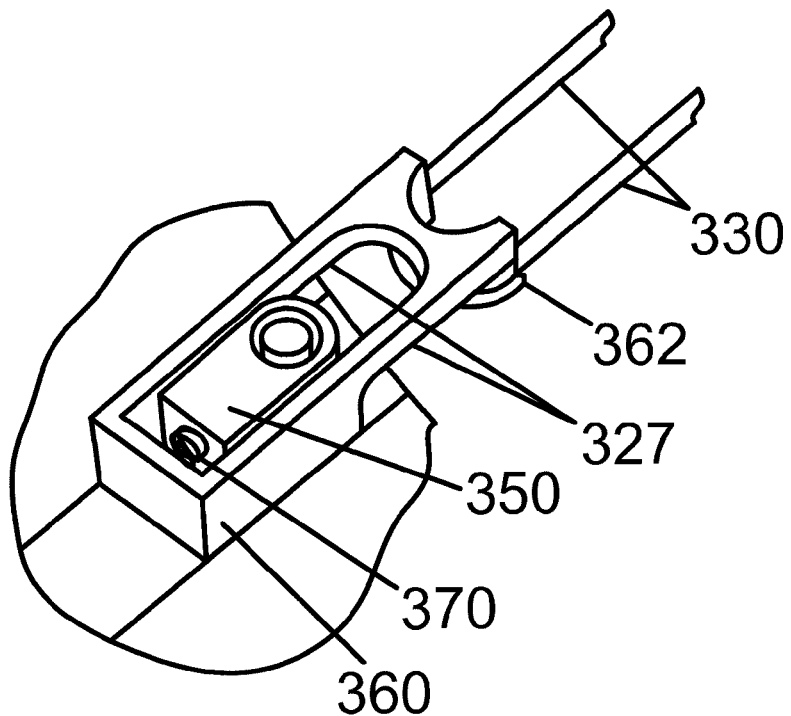
FIG. 5D provides a perspective view of the dynamic mounting device shown in FIG. 5A.

As shown in FIGS. 5B and 5C, a cross-sectional view of the thermal break 327 is provided. The thermal break 327 comprises one or more arms 329 extending between the slidable member 363 and the capture member 362. For example, the one or more arms 329 may include two reduced cross-sectional area arms extending from the pair of guide rail members 366 of slidable member 363 to the capture member 362. The cross-sectional dimensions, $329a$ (width) and $329b$ (height), and the length, $329c$, of the thermal break 327 may be selected to reduce or minimize the heat transfer coefficient (h) between the capture member 362 and the slidable member 363, wherein h=kA/l (k represents the thermal conductivity of the thermal break, A represents the cross-sectional area of the thermal break, and l represents the length of the thermal break). Additionally, the cross-sectional dimensions, 329a (width) and 329b (height), may be selected to maintain the mechanical integrity of the thermal break 327. The cross-sectional shape of the thermal break 327, e.g., each of the one or more arms 329, may be square, rectangular, triangular, circular, or any arbitrary shape.

According to one embodiment, the width (329a) of the thermal break 327 may range from about 0.5 mm (millimeter) to about 10 mm. According to another embodiment, the width (329a) of the thermal break 327 may range from about 1 mm to about 5 mm. According to another embodiment, the width (329a) of the thermal break 327 may range from about 2 mm to about 5 mm. According to yet another embodiment, the width (329a) of the thermal break 327 may range from about 3 mm to about 4 mm.

According to one embodiment, the height (329b) of the thermal break 327 may range from about 0.5 mm (millimeter) to about 10 mm. According to another embodiment, the height (329b) of the thermal break 327 may range from about 1 mm to about 5 mm. According to another embodiment, the height (329b) of the thermal break 327 may range from about 2 mm to about 5 mm. According to yet another embodiment, the height (329b) of the thermal break 327 may range from about 3 mm to about 4 mm.

According to one embodiment, the length (329c) of the thermal break 327 may range from about 0.1 cm (centimeter) to about 5 cm. According to another embodiment, the length (329c) of the thermal break 327 may range from about 0.5 cm to about 2 cm. According to another embodiment, the length (329c) of the thermal break 327 may range from about 0.5 cm to about 1.5 cm. According to yet another embodiment, the length (329c) of the thermal break 327 may range from about 0.5 cm to about 1 cm.

According to one embodiment, the thermal break 327 comprises dimensions such that a heat transfer coefficient of the thermal break 327 is about 0.1 W/m-K (Watts per meter-Kelvin) or less. According to another embodiment, the thermal break 327 comprises dimensions such that a heat transfer coefficient of the thermal break 327 is about 0.05 W/m-K or less. According to another embodiment, the thermal break 327 comprises dimensions such that a heat transfer coefficient of the thermal break 327 is about 0.04 W/m-K or less. According to another embodiment, the thermal break 327 comprises dimensions such that a heat transfer coefficient of the thermal break 327 is about 0.03 W/m-K or less. According to another embodiment, the thermal break 327 comprises dimensions such that a heat transfer coefficient of the thermal break 327 is about 0.02 W/m-K or less. According to yet another embodiment, the thermal break 327 comprises dimensions such that a heat transfer coefficient of the thermal break 327 is about 0.01 W/m-K or less.

Figure 6:
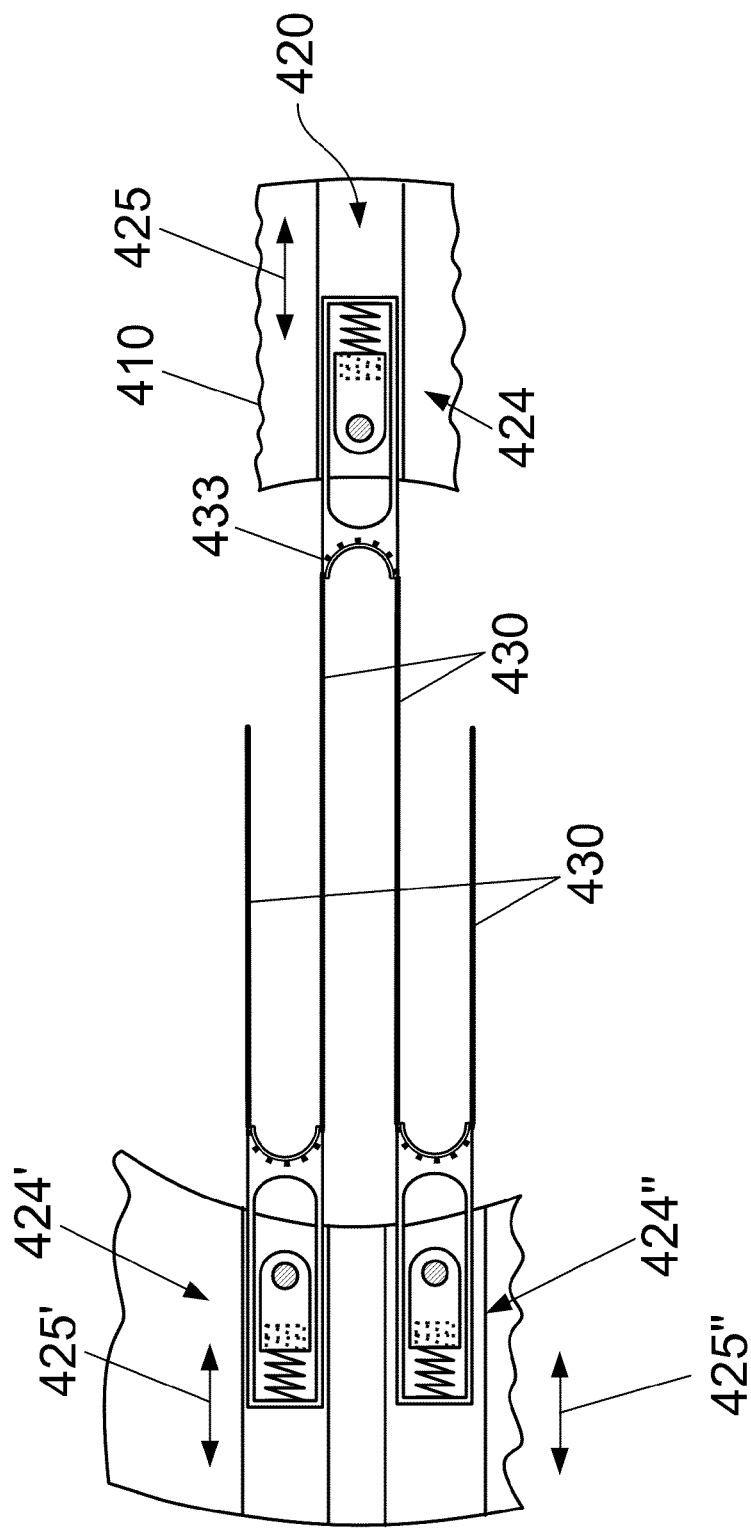
FIG. 6 provides a top view of a heating element according to another embodiment.

Referring now to FIG. 6, a top view of a heat source 420 is presented according to another embodiment. The heat source 420 comprises a resistive heating element 430 following a serpentine-like path that weaves through a plurality of dynamic structures (424, 424', and 424") coupled to a mounting structure 410 and configured to move in directions (425, 425', and 425"), respectively. For example, the serpentine-like path may comprise substantially straight sections interconnected by bends 433. One end of the serpentine-like path may be connected to a power source, while the opposing end of the serpentine-like path may be connected to the electrical ground for the power source. In this embodiment, the plurality of dynamic mounting devices (424, 424', and 424") can alleviate slack or sagging in the resistive heating element 430, and they may substantially reduce or minimize slippage between the resistive heating element 430 and the dynamic mounting devices 424 (such slippage may cause particle generation and/or contamination).

Although the gas heating device has been described for use in a deposition system, the gas heating device may be used in any system requiring gas heating of a process component, such as a film forming composition. Other systems in semiconductor manufacturing and integrated circuit (IC) manufacturing may include etching systems, thermal processing systems, etc.

Figure 7:
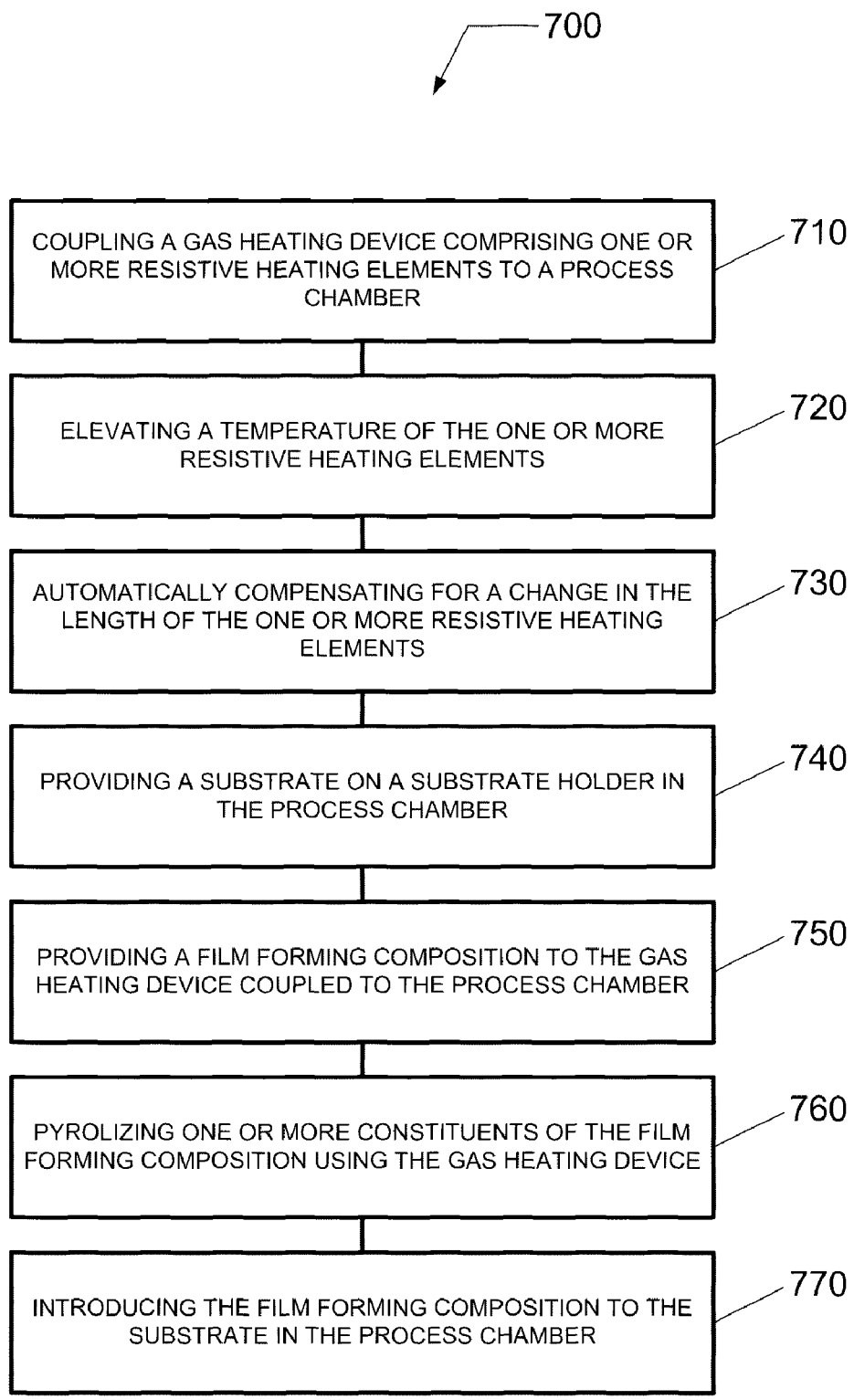
FIG. 7 illustrates a method of depositing a film on a substrate according to an embodiment.

FIG. 7 illustrates a method of depositing a thin film on a substrate according to another embodiment. The method 700 includes, at 710, coupling a gas heating device to a process chamber for a deposition system, wherein the gas heating device comprises one or more resistive heating elements and a mounting structure configure to support the one or more resistive elements.

In 720, a temperature of the one or more resistive heating elements is elevated. For example, the temperature may be elevated by flowing electrical current through the one or more resistive heating elements.

In 730, a change in the length of the one or more resistive heating elements is automatically compensated by one or more dynamic mounting devices coupled to the mounting structure. For example, the compensation for the change in element length may be performed while substantially reducing slippage between the one or more resistive heating elements and the dynamic mounting device. Furthermore, each of the one or more dynamic mounting devices includes a thermal break to reduce heat transfer between the one or more resistive heating elements and the mounting structure.

In 740, a substrate is provided in the process chamber of the deposition system. For example, the deposition system can include the deposition system described above in FIG. 1. The substrate can, for example, be a Si substrate. A Si substrate can include n- or p-type material, depending on the type of device being formed. The substrate can be of any size, for example a 200 mm substrate, a 300 mm substrate, or an even larger substrate. According to an embodiment of the invention, the substrate can be a patterned substrate containing one or more vias or trenches, or combinations thereof.

In 750, a film forming composition is provided to a gas distribution system that is configured to introduce the film forming composition to the process chamber above the substrate. For example, the gas distribution system can be located above the substrate and opposing an upper surface of the substrate.

In 760, one or more constituents of the film forming composition are subjected to pyrolysis using the gas heating device. The gas heating device can be any one of the systems described in FIGS. 2 through 6 above, or any combination thereof.

In 770, the substrate is exposed to the film forming composition to facilitate the formation of the thin film. The temperature of the substrate can be set to a value less than the temperature of the one or more heating elements, e.g. one or more resistive film heating elements. For example, the temperature of the substrate can be approximately room temperature.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A gas heating device, comprising:
one or more resistive heating elements configured to receive an electrical signal from one or more power sources;
a mounting structure configured to support at least one of said one or more resistive heating elements, said mounting structure comprising:
a static mounting device coupled to said mounting structure and configured to fixedly couple said at least one of said one or more resistive heating elements to said mounting structure, and
a dynamic mounting device coupled to said mounting structure and configured to automatically compensate for changes in a length of said at least one of said one or more resistive heating elements,
wherein said dynamic mounting device comprises a thermal break configured to reduce heat transfer between said dynamic mounting device and said mounting structure,
wherein said dynamic mounting device comprises a static structure coupled to said mounting structure and having a guide feature, a helical spring configured to be received by said guide feature of said static structure, and a dynamic structure having a capture member configured to retain at least one of said one or more resistive heating elements, a slidable member configured to slidably mate with said static structure and compress said helical spring against said static structure when loaded with said at least one of said one or more resistive heating elements, and said thermal break disposed between said capture member and said slidable member, and
wherein the capture member is inward of the thermal break which is inward of the sliding member.

2. The gas heating device of claim 1, wherein said at least one of said one or more resistive heating elements comprises a first end fixedly coupled to said static mounting device, a second end fixedly coupled to said dynamic mounting device, and a straight section extending between said first end and said second end.

3. The gas heating device of claim 1, wherein said at least one of said one or more resistive heating elements comprises a first end fixedly coupled to said static mounting device, a second end fixedly coupled to said static mounting device, a bend coupled to said dynamic mounting device and located between said first end and said second end, a first straight section extending between said first end and said bend, and a second straight section extending between said second end and said bend.

4. The gas heating device of claim 3, wherein said first straight section and said second straight section are substantially the same length.

5. The gas heating device of claim 3, wherein said bend comprises approximately 180 degrees.

6. The gas heating device of claim 1, wherein said dynamic mounting device is configured to adjust in a linear direction relative to said static mounting device in order to compensate for changes in the length of said first straight section and the length of said second straight section.

7. The gas heating device of claim 1, wherein said thermal break comprises a ceramic or plastic member.

8. The gas heating device of claim 1, wherein said thermal break comprises dimensions such that a heat transfer coefficient of said thermal break is about 0.1 W/m-K (Watts per meter-Kelvin) or less.

9. The gas heating device of claim 1, wherein said thermal break comprises dimensions such that a heat transfer coefficient of said thermal break is about 0.05 W/m-K (Watts per meter-Kelvin) or less.

10. The gas heating device of claim 1, wherein said mounting structure is configured to couple said gas heating device at an outlet of a gas distribution system, and wherein said gas distribution system is configured to distribute and flow a film forming composition across or through said one or more resistive heating elements in order cause pyrolysis of one or more constituents of said film forming composition when heated.

11. The gas heating device of claim 10, wherein said gas distribution system comprises a plenum configured to receive said film forming composition, and one or more openings aligned with said one or more resistive heating elements and configured to distribute and flow said film forming composition over said one or more resistive heating elements.

12. The gas heating device of claim 1, wherein said one or more power sources comprise a direct current (DC) power source or an alternating current (AC) power source.

13. The gas heating device of claim 1, wherein said at least one of said one or more resistive heating elements comprises a metal-containing ribbon.

14. The gas heating device of claim 1, wherein each of said static mounting device and said dynamic mounting device comprises an electrically insulating material.

15. A gas heating device, comprising:
one or more resistive heating elements configured to receive an electrical signal from one or more power sources;
a mounting structure configured to support at least one of said one or more resistive heating elements, said mounting structure comprising:
a static mounting device coupled to said mounting structure and configured to fixedly couple said at least one of said one or more resistive heating elements to said mounting structure, and
a dynamic mounting device coupled to said mounting structure and configured to automatically compensate for changes in a length of said at least one of said one or more resistive heating elements,
wherein said dynamic mounting device comprises a thermal break configured to reduce heat transfer between said dynamic mounting device and said mounting structure,
wherein said dynamic mounting device comprises a static structure coupled to said mounting structure and having a guide feature, a helical spring configured to be received by said guide feature of said static structure, and a dynamic structure having a capture member configured to retain at least one of said one or more resistive heating elements, a slidable member configured to slidably mate with said static structure and compress said helical spring against said static structure when loaded with said at least one of said one or more resistive heating elements, and said thermal break disposed between said capture member and said slidable member,
wherein said slidable member comprises a load member having a load surface configured to contact said helical spring and a pair of guide rail members extending from said load member, each of said pair of guide rail members extending on opposite sides of said static structure and having guide surfaces parallel with opposing faces of said static structure.

16. A gas heating device, comprising:

one or more resistive heating elements configured to receive an electrical signal from one or more power sources;

a mounting structure configured to support at least one of said one or more resistive heating elements, said mounting structure comprising:

a static mounting device coupled to said mounting structure and configured to fixedly couple said at least one of said one or more resistive heating elements to said mounting structure, and a dynamic mounting device coupled to said mounting structure and configured to automatically compensate for changes in a length of said at least one of said one or more resistive heating elements, wherein said dynamic mounting device comprises a thermal break configured to reduce heat transfer between said dynamic mounting device and said mounting structure, wherein said dynamic mounting device comprises a static structure coupled to said mounting structure and having a guide feature, a helical spring configured to be received by said guide feature of said static structure, and a dynamic structure having a capture member configured to retain at least one of said one or more resistive heating elements, a slidable member configured to slidably mate with said static structure and compress said helical spring against said static structure when loaded with said at least one of said one or more resistive heating elements, and said thermal break disposed between said capture member and said slidable member, wherein said thermal break comprises a pair of arms extending between said slidable member and said capture member.

17. A processing system for depositing a thin film on a substrate, comprising:

a process chamber having a pumping system configured to evacuate said process chamber;

a substrate holder coupled to said process chamber and configured to support said substrate;

a gas distribution system coupled to said process chamber and configured to introduce a film forming composition to a process space in the vicinity of a surface of said substrate; and the gas heating device of claim 1 coupled to an outlet of said gas distribution system.

18. A gas distribution system for introducing a process gas to a processing system, comprising:

the gas heating device of claim 1 coupled to an outlet of said gas distribution system; and a gas distribution member having one or more openings aligned with said one or more resistive heating elements and configured to distribute and flow a process gas from a plenum configured to receive said process gas over said one or more resistive heating elements.

19. The gas distribution system of claim 18, further comprising:

one or more additional gas heating devices of claim 1.

* * * * *